(12) United States Patent
Rho

(10) Patent No.: US 10,121,537 B2
(45) Date of Patent: Nov. 6, 2018

(54) ELECTRONIC DEVICE

(71) Applicant: SK hynix Inc., Icheon-Si (KR)

(72) Inventor: Kwang-Myoung Rho, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/704,995

(22) Filed: Sep. 14, 2017

(65) Prior Publication Data

US 2018/0158523 A1 Jun. 7, 2018

(30) Foreign Application Priority Data

Dec. 2, 2016 (KR) .................. 10-2016-0163322

(51) Int. Cl.
*G11C 7/10* (2006.01)
*G11C 11/16* (2006.01)
*G11C 13/00* (2006.01)

(52) U.S. Cl.
CPC ........ *G11C 13/004* (2013.01); *G11C 11/1673* (2013.01); *G11C 11/1693* (2013.01); *G11C 13/0061* (2013.01); *G11C 13/0007* (2013.01); *G11C 2013/0042* (2013.01); *G11C 2013/0045* (2013.01); *G11C 2013/0054* (2013.01); *G11C 2207/002* (2013.01)

(58) Field of Classification Search
CPC ... G11C 7/1072; G11C 13/004; G11C 11/161; G11C 16/26; G11C 8/08; G11C 7/10; G11C 11/16; G11C 13/00
See application file for complete search history.

(56) References Cited

U.S. PATENT DOCUMENTS

| | | | |
|---|---|---|---|
| 2016/0064056 A1* | 3/2016 | Kim | G11C 8/08 365/189.11 |
| 2017/0236568 A1* | 8/2017 | Rho | G11C 7/1072 711/105 |

FOREIGN PATENT DOCUMENTS

| | | |
|---|---|---|
| KR | 10-0640156 | 10/2006 |
| KR | 10-2010-0046531 | 5/2010 |

* cited by examiner

*Primary Examiner* — Hien Nguyen
(74) *Attorney, Agent, or Firm* — Perkins Coie LLP

(57) ABSTRACT

An electronic device includes a semiconductor memory that includes: resistive storage cells; a reference resistance cell; a comparison block electrically coupled to the resistive storage cells and the reference resistance cell through first and second input terminals, to compare a cell current flowing through the first input terminal and a reference current flowing through the second input terminal; a first clamp part to control a maximum current amount of the cell current depending on a voltage level of a first node; a second clamp part to control a maximum current amount of the reference current depending on the voltage level of the first node; a voltage stabilization block to stabilize a voltage of the first node during a charging or a discharging period; and a switching part electrically coupled with the first node and the voltage stabilization block in the charging period or the discharging period.

19 Claims, 14 Drawing Sheets

"ELECTRONIC DEVICE"

ELECTRONIC DEVICE

CROSS-REFERENCE TO RELATED APPLICATION

This patent document claims priority of Korean Patent Application No. 10-2016-0163322, entitled "ELECTRONIC DEVICE" and filed on Dec. 2, 2016, which is incorporated herein by reference in its entirety.

TECHNICAL FIELD

This patent document relates to memory circuits or devices and their applications in electronic devices or system.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which reduces operation noise in a sensing process.

In one aspect, an electronic device includes a semiconductor memory that includes: a plurality of resistive storage cells each structured to exhibit different resistance values for storing data; a reference resistance cell; a comparison block electrically coupled to the plurality of resistive storage cells through a first input terminal and the reference resistance cell through a second input terminal, the comparison block operable to compare a cell current flowing through the first input terminal and a reference current flowing through the second input terminal; a first clamp part having terminals including a first terminal coupled to the plurality of resistive storage cells, a second terminal coupled to the first input terminal, and a third terminal coupled to a first node, and operable to control a maximum current amount of the cell current depending on a voltage level of the first node; a second clamp part coupled between the reference resistance cell and the second input terminal, and operable to control a maximum current amount of the reference current depending on the voltage level of the first node; a voltage stabilization block electrically coupled to the first clamp part through the first node and operable to stabilize a voltage of the first node during a charging or a discharging period; and a switching part electrically coupled with the first node and the voltage stabilization block in the charging period or the discharging period.

Implementations of the above method may include one or more of the following.

The semiconductor memory may further include: a clamp voltage generation block coupled to the first node and operable to generate a clamp voltage and apply the generated clamp voltage to the first node. The voltage stabilization block may include: a plurality of capacitors coupled in parallel; and a stabilization clamp voltage generation unit coupled to first ends of the capacitors and operable to generate a stabilization clamp voltage which has the same level as the clamp voltage, and apply the stabilization clamp voltage to the first ends the plurality of capacitors. The voltage stabilization block may include: a plurality of capacitors coupled in parallel; a stabilization clamp voltage generation unit operable to generate a stabilization clamp voltage which has the same level as the clamp voltage; and a coupling unit coupled between the stabilization clamp voltage generation unit and first ends of the capacitors and operable to drive the capacitors depending on a comparison result of a voltage across the capacitors and the stabilization clamp voltage, in the charging period or the discharging period. The charge period may include a point of time when a read operation is started, and the discharging period includes a point of time when the read operation is ended. The comparison block may sense data of a resistive storage cell selected among the plurality of resistive storage cells, by comparing the cell current and the reference current. The semiconductor memory may further include: a bit line to which the first terminals of the plurality of resistive storage cells are coupled; and a source line to which second terminals of the plurality of resistive storage cells are coupled, and wherein the bit line is coupled with the first clamp part. The semiconductor memory may further include: a plurality of additional resistive storage cells each structured to exhibit different resistance values for storing data; an additional reference resistance cell; an additional comparison block electrically coupled to the plurality of additional resistive storage cells through a third input terminal and the additional reference resistance cell through a fourth input terminal, the additional comparison block operable to compare a corresponding cell current flowing through the third input terminal and a corresponding reference current flowing through the fourth input terminal; an additional first clamp part having terminals including a first terminal coupled to the plurality of additional resistive storage cells, a second terminal coupled to the third input terminal, and a third terminal coupled to the first node, and operable to control a maximum current amount of the corresponding cell current depending on the voltage level of the first node; and an additional second clamp part coupled between the additional reference resistance cell and the fourth input terminal, and operable to control a maximum current amount of the corresponding reference current depending on the voltage level of the first node.

The semiconductor memory may further include: an additional switching part coupled between the first node and a second node and driven to be turned on in a different period except the charging period and the discharging period, the second node being connected with the clamp voltage generation block. The clamp voltage generation block may include: a current source; a replica resistor cell; and a coupling element having a first terminal coupled to the current source, a second terminal coupled to the replica resistor cell, and a third terminal coupled to the first node or the second node. The plurality of resistive storage cells may include a resistive storage cell including a variable resistance element with a structure in which a tunnel barrier layer is interposed between two magnetic layers. The reference resistance cell may have a resistance value between the different resistance values of each resistive storage cell. The clamp voltage may have a maximum value during the charging period, the maximum value less than of the electronic device without the voltage stabilization block. The clamp voltage may have a minimum value during the discharging period, the minimum value less than of the electronic device without the voltage stabilization block.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device is provided to include a semiconductor memory, wherein the semiconductor memory comprises: a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a clamp voltage generation block suitable for generating a clamp voltage and applying the clamp voltage to a second node; a voltage stabilization block suitable for stabilizing a voltage of the first node in a charge period or a discharge period; a first switching part suitable for electrically coupling the first node and the voltage stabilization block in the charge period or the discharge period; and a second switching part coupled between the first node and the second node, and suitable for being turned on in a period other than the charge period or the discharge period.

In some implementations, the clamp voltage generation block comprises: a current source; a replica resistor cell; and a coupling element coupled to the current source at one end thereof, coupled to the replica resistor cell at the other end thereof, and coupled to the second node at the one end and a gate thereof. In some implementations, the voltage stabilization block comprises: a plurality of capacitors; and a stabilization clamp voltage generation unit suitable for generating a stabilization clamp voltage which has the same level as the clamp voltage, and applying the stabilization clamp voltage to one ends of the plurality of capacitors. In some implementations, the voltage stabilization block comprises: a plurality of capacitors; a stabilization clamp voltage generation unit suitable for generating a stabilization clamp voltage which has the same level as the clamp voltage; and a coupling unit suitable for driving one ends of the plurality of capacitors depending on a result of comparing a voltage of the one ends of the plurality of capacitors and the stabilization clamp voltage, in the charge period or the discharge period, and transferring the stabilization clamp voltage to the one ends of the plurality of capacitors in the other periods. In some implementations, the charge period includes a point of time when a read operation is started, and the discharge period includes a point of time when the read operation is ended. In some implementations, the comparison block senses and amplifies data of a resistive storage cell selected among the plurality of resistive storage cells, by comparing the cell current and the reference current. In some implementations, the semiconductor memory further comprises: a plurality of memory banks, and wherein each of the plurality of memory banks comprises: a plurality of resistive storage cells; a reference resistance cell; a comparison block suitable for comparing a cell current of a first input terminal and a reference current of a second input terminal; a first clamp transistor coupled between one ends of the plurality of resistive storage cells and the first input terminal, and suitable for controlling a maximum current amount of the cell current depending on a voltage level of a control node; a second clamp transistor coupled between one end of the reference resistance cell and the second input terminal, and suitable for controlling a maximum current amount of the reference current depending on the voltage level of the control node; a voltage stabilization block suitable for stabilizing a voltage of the control node in the charge period or the discharge period; a first switch suitable for electrically coupling the control node and the voltage stabilization block in the charge period or the discharge period; and a second switch coupled between the control node and the second node, and suitable for being turned on in a period other than the charge period or the discharge period.

These and other aspects, implementations and associated advantages are described in greater detail in the drawings, the description and the claims.

DETAILED DESCRIPTION

The disclosed technology may be implemented in various examples and implementations which are described below in detail with reference to the accompanying drawings.

A semiconductor memory device in accordance with implementations of the disclosed technology may include a variable resistance element that exhibits a variable resistance characteristic that allows to have different resistance states of different resistance values for representing different data for data storage. A resistance state of the variable resistance element may be changed by applying a voltage or current of a sufficient magnitude in a data write operation. Therefore, the variable resistance element is capable of storing different data. In implementations, such a variable resistance element may include a single layer or a multi-layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

Moreover, the variable resistance element may include a phase change material. The phase change material may include a chalcogenide material such as germanium-antimony-tellurium (GST: GeSbTe). The variable resistance element switches between different resistance states by changing a crystal state or an amorphous state using a heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

Figure 1:
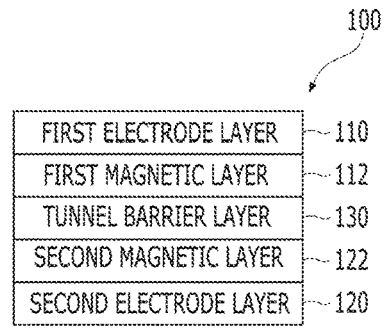
FIG. 1 is a diagram showing an example of a magnetic tunnel junction (MTJ) as one of structures in which a tunnel barrier layer is interposed between two ferromagnetic layers.

FIG. 1 is a diagram showing an example of a magnetic tunnel junction (MTJ) as one of structures in which a tunnel barrier layer is interposed between two ferromagnetic layers.

As shown in FIG. 1, an MTJ 100 includes a first electrode layer 110 as a top electrode, a second electrode layer 120 as a bottom electrode, a first ferromagnetic layer 112 and a second ferromagnetic layer 122 as a pair of ferromagnetic layers, and a tunnel barrier layer 130 which is formed between the pair of ferromagnetic layers 112 and 122.

The first ferromagnetic layer 112 may be or include a free ferromagnetic layer of which magnetization direction may be changed depending on the direction of the current applied to the MTJ 100, and the second ferromagnetic layer 122 may be or include a pinned ferromagnetic layer of which magnetization direction is pinned.

Such an MTJ 100 is can be controlled to change its resistance value depending on the direction of the current at a sufficiently high magnitude and this property can be used for storing different data such as "0" or "1."

Figure 2A:
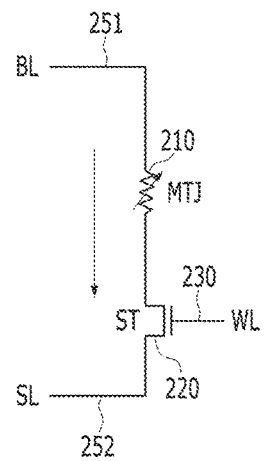
FIGS. 2A and 2B are views explaining a principle of storing data in a variable resistance element.
Figure 2B:
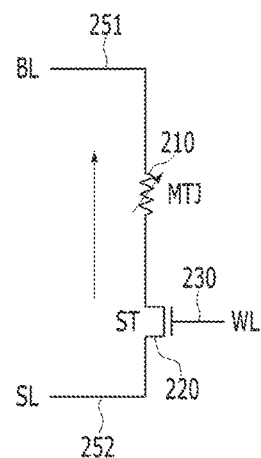

FIGS. 2A and 2B are views explaining a principle of storing data in a variable resistance element 210. The variable resistance element 210 may be or include the MTJ 100 described above with reference to FIG. 1.

First, FIG. 2A is a diagram explaining a principle of recording data with a low logic value in the variable resistance element 210. In order to select the variable resistance element 210 to store data, a word line 230 electrically coupled to the variable resistance element 210 is activated, and a transistor 220 serving as a switching transistor ST is turned on. This can be achieved by turning on the transistor 220 coupled to the variable resistance element 210 under an applied voltage at the word line 230 coupled to the gate of the transistor 220 in the example shown in FIG. 2A. Once the transistor 220 is turned on, a current can be directed to flow from one end 251 toward the other end 252 (in the direction indicated by the arrow), that is, from the first electrode layer 110 as the top electrode of the MTJ 100 shown in FIG. 1 to the second electrode layer 120 as the bottom electrode, the magnetization direction of the first ferromagnetic layer 112 as the free ferromagnetic layer and the magnetization direction of the second ferromagnetic layer 122 as the pinned ferromagnetic layer become parallel to each other, and the variable resistance element 210 has a low resistance state. When the variable resistance element 210 is the low resistance state, it is defined that 'low' data is stored in the variable resistance element 210.

Next, FIG. 2B is a diagram explaining a principle of recording data with a high logic value in the variable resistance element 210. In a similar manner, the word line 230 coupled to the transistor 220 which is electrically coupled to the variable resistance element 210 is activated, and the transistor 220 is turned on. As a current flows from the other end 252 toward one end 251 (in the direction indicated by the arrow), that is, from the second electrode layer 120 to the first electrode layer 110, the magnetization direction of the first ferromagnetic layer 112 and the magnetization direction of the second ferromagnetic layer 122 become anti-parallel to each other, and the variable resistance element 210 has a high resistance state. When the variable resistance element 210 is the high resistance state, it is defined that 'high' data is stored in the variable resistance element 210.

The logic value of the data stored in the variable resistance element 210 is changed depending on the resistance value of the variable resistance element 210. In the case where the difference between the resistance values of the high resistance state and the low resistance state of the variable resistance element 210 is great, it is easy to determine the data stored in the variable resistance element 210. In the case where the difference between the resistance values of the high resistance state and the low resistance state of the variable resistance element 210 is small, it is difficult to determine the data stored in the variable resistance element 210, and thus, the probability of an error to occur in discriminating data increases. Therefore, a technology capable of precisely discriminating the data stored in a variable resistance element even when the difference between the resistance values of the high resistance state and the low resistance state of the variable resistance element is small is demanded in the art.

Figure 3:
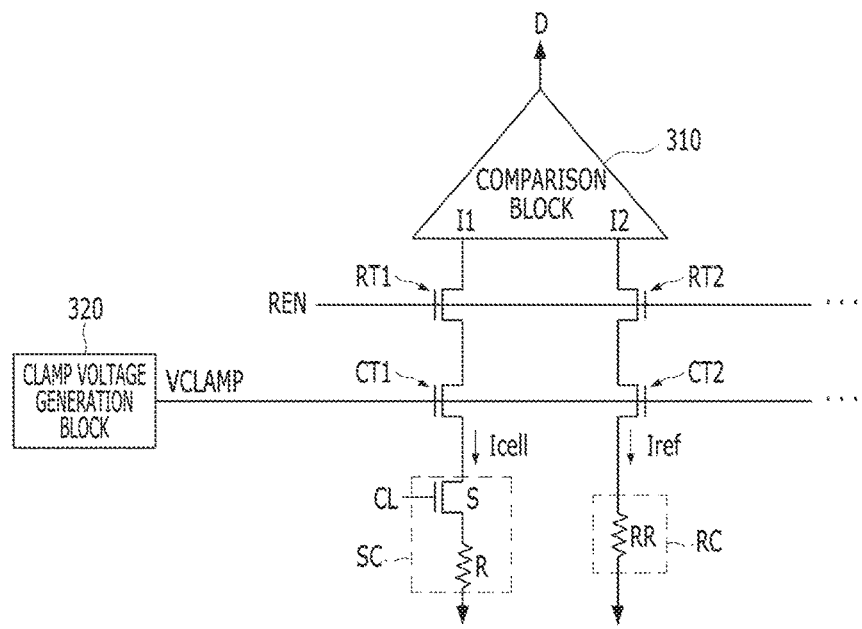
FIG. 3 is a configuration diagram illustrating a representation of an example of a memory circuit (device) including variable resistance elements.

FIG. 3 is a configuration diagram illustrating a representation of an example of a memory circuit (device) including variable resistance elements.

Referring to FIG. 3, the memory circuit (device) may include a comparison block 310, a clamp voltage generation block 320, read enable transistors RT1 and RT2, clamp transistors CT1 and CT2, a resistive storage cell SC, and a reference resistance cell RC.

The comparison block 310 may include first and second input terminals I1 and I2. The first input terminal I1 may be coupled with the resistive storage cell SC through the transistors RT1 and CT1, and the second input terminal I2 may be coupled with the reference resistance cell RC through the transistors RT2 and CT2. In a read operation, a cell current Icell may flow through the first input terminal I1 and the resistive storage cell SC, and a reference current Iref may flow through the second input terminal I2 and the reference resistance cell RC.

The read enable transistors RT1 and RT2 may be turned on when a read enable signal REN which is activated in a read operation period is activated, and be turned off when the read enable signal REN is deactivated. The clamp transistors CT1 and CT2 may control the maximum current amounts of the cell current Icell and the reference current Iref depending on the voltage level of a clamp voltage VCLAMP. The clamp voltage VCLAMP may be generated by the clamp voltage generation block 320.

The resistive storage cell SC may include a variable resistance element R and a selection element S which is coupled in series to the variable resistance element R. The selection element S may have a gate coupled to a corresponding control line CL, e.g., a word line. The variable resistance element R has different resistance states of different resistance values for representing different data bits. In some implementations, the variable resistance element R may have a low resistance state in the case where 'low' data bit is stored, and have a high resistance state in the case where 'high' data bit is stored. Alternatively, the variable resistance element R may have a low resistance state in the case where 'high' data bit is stored, and have a high resistance state in the case where 'low' data bit is stored. Hereinbelow, descriptions will be made for the operation of the memory circuit, by exemplifying the former case. The reference resistance cell RC may include a reference resistance element RR which has a resistance value between the resistance value of the low resistance state of the variable resistance element R and the resistance value of the high resistance state of the variable resistance element R.

The comparison block 310 may sense and amplify the data of the resistive storage cell SC by comparing the current amounts of the cell current Icell and the reference current Iref in a read operation, and output an output D thereof. The comparison block 310 may output the output D with 'low' data bit such as "0" when the current amount of the cell current Icell is greater than the current amount of the reference current Iref, and output D with 'high' data bit such as "1" when the current amount of the cell current Icell is smaller than the current amount of the reference current Iref.

Figure 4:
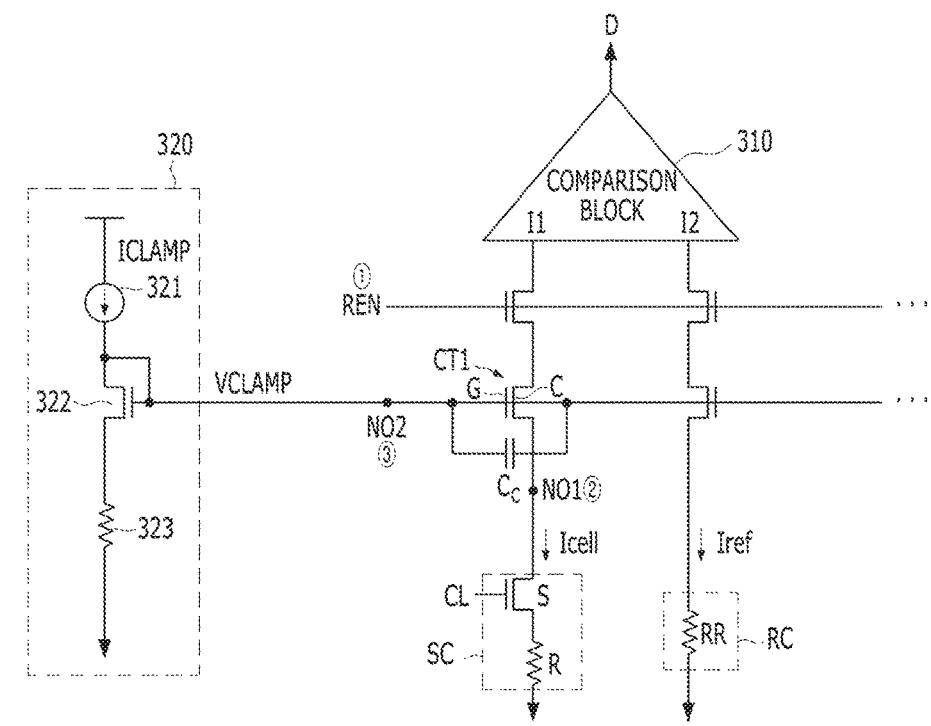
FIG. 4 is a representation of an example of a diagram to assist in the explanation of a problem that is likely to occur during a read operation in the memory circuit (device) illustrated in FIG. 1.

FIG. 4 is a representation of an exemplary diagram to explain a problem that is likely to occur during a read operation in the memory circuit (device) illustrated in FIG. 3.

Referring to FIG. 4, the clamp voltage generation block 320 may include a current source 321, a transistor 322, and a replica resistor element 323.

If the read enable signal REN transitions from a 'low' level to a 'high' level in a read operation (①), the voltage of a terminal NO1 of the resistive storage cell SC may be charged from a low voltage level to an operating voltage level (②) under the condition that the selection element S is turned on. If the voltage of a channel C of the clamp transistor CT1 is increased momentarily for a transient response period in which the voltage of the terminal NO1 is charged, the transient response generates noise in a node NO2 in which the clamp voltage VCLAMP is generated by the influence of a coupling capacitance Cc connected between the channel C and a gate G (③).

Such noise in the clamp voltage VCLAMP may cause the clamp transistor CT1 to lose or negatively affect a function of appropriately controlling the maximum current amount of the cell current Icell, thereby increasing a sensing standby time. The sensing standby time refers to time from when the read enable signal REN transitions from the 'low' level to the 'high' level to when the comparison block 310 starts sensing of the cell current Icell. In addition, if noise is severe, the comparison block 310 may not sense the data of the resistive storage cell SC.

Figure 5:
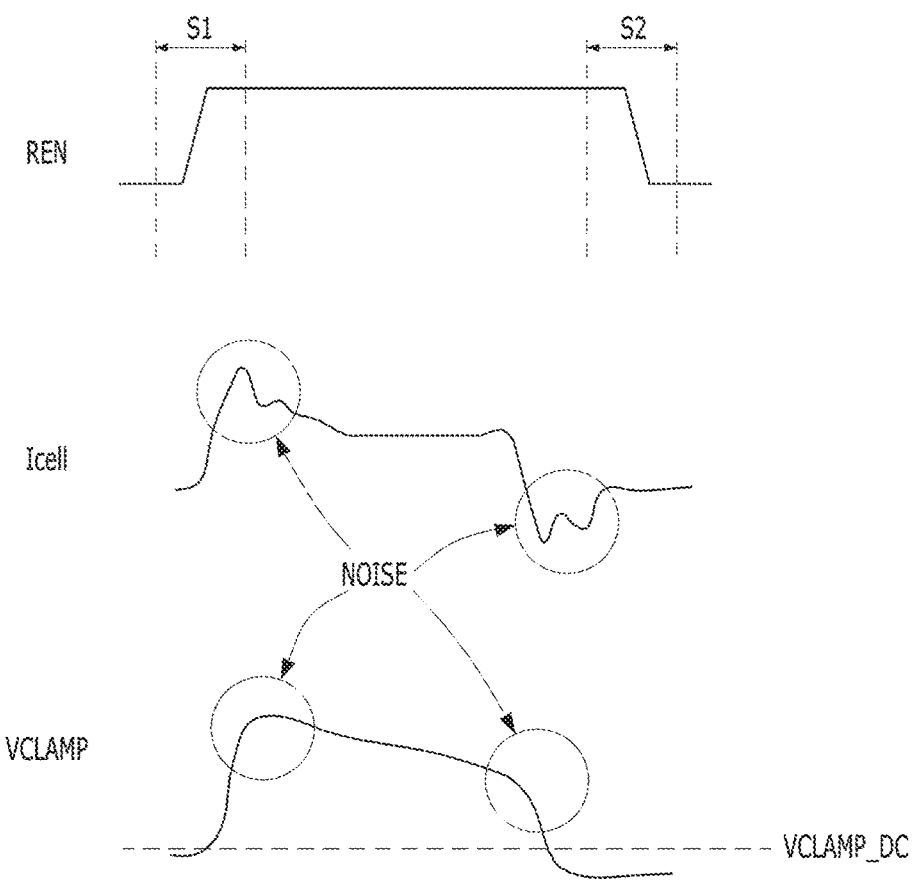
FIG. 5 is a diagram illustrating a representation of an example of waveforms of a read enable signal REN, a cell current Icell and a clamp voltage VCLAMP in the memory circuit (device) of FIGS. 2A-B.

FIG. 5 is a diagram illustrating a representation of an example of waveforms of the read enable signal REN, the cell current Icell and the clamp voltage VCLAMP in the memory circuit (device) of FIG. 4.

Referring to FIG. 5, noise NOISE may be generated in the cell current Icell and the clamp voltage VCLAMP because of a period S1 in which the read enable signal REN transitions from the 'low' level to the 'high' level or a period S2 in which the read enable signal REN transitions from the 'high' level to the 'low' level.

Figure 6:
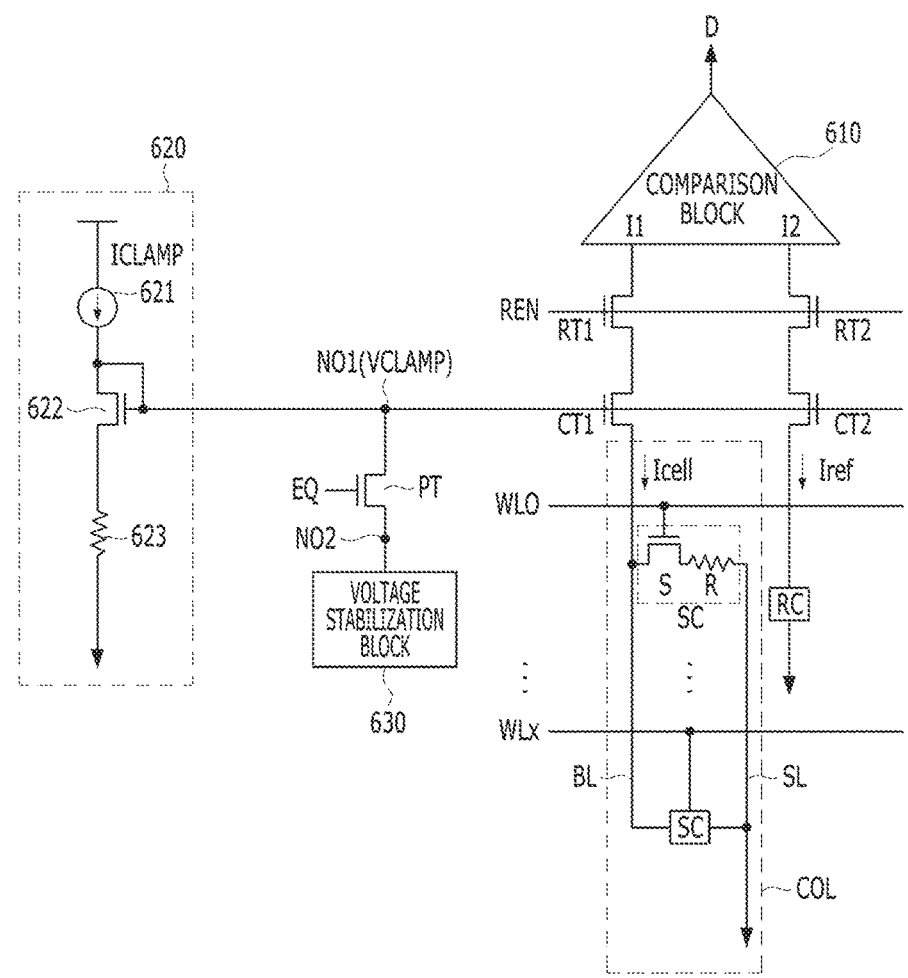
FIG. 6 is a configuration diagram illustrating a representation of an example of a memory circuit (device) including variable resistance elements.

FIG. 6 is a configuration diagram illustrating a representation of an example of a memory circuit (device) including variable resistance elements.

Referring to FIG. 6, the memory circuit (device) may include a plurality of resistive storage cells SC, a reference resistance cell RC, a comparison block 610, a clamp voltage generation block 620, a voltage stabilization block 630, first and second read enable parts RT1 and RT2, first and second clamp parts CT1 and CT2, and a switching part PT.

Each of the resistive storage cells SC may include a variable resistance element R and a selection element S which is coupled in series to the variable resistance element R. In some implementations, the variable resistance element R may have a low resistance state in the case where low' data bit is stored, and have a high resistance state in the case where 'high' data bit is stored. Alternatively, the variable resistance element R may have a low resistance state in the case where 'high' data bit is stored, and have a high resistance state in the case where low' data bit is stored. The selection element S may be coupled to a corresponding word line among a plurality of word lines WL0 to WLx (x is a natural number). The selection element S may be turned on in the case where the corresponding word line is activated and be turned off in the case where the corresponding word line is deactivated. In FIG. 6, for the sake of convenience in illustration, the internal configuration is illustrated for only one resistive storage cell SC, and the internal configuration is omitted for the remaining resistive storage cells SC.

A bit line BL may be coupled to one ends of the plurality of resistive storage cells SC, and a source line SL may be coupled to the other ends of the plurality of resistive storage cells SC. The plurality of resistive storage cells SC, the bit line BL and the source line SL may configure one column COL. The first read enable part RT1 and the first clamp part CT1 may be coupled in series between a first input terminal I1 of the comparison block 610 and the bit line BL. The second read enable part RT2 and the second clamp part CT2 may be coupled in series between a second input terminal I2 of the comparison block 610 and the reference resistance cell RC.

The first and second read enable parts RT1 and RT2 may be turned on when a read enable signal REN which is activated in a read operation period is activated, and be turned off when the read enable signal REN is deactivated. For example, each of the first and second read enable parts RT1 and RT2 may include a transistor. The first and second clamp parts CT1 and CT2 may control the maximum current amounts of a cell current Icell and a reference current Iref depending on the voltage level of a clamp voltage VCLAMP. For example, each of the first and second clamp parts CT1 and CT2 may include a transistor.

The comparison block 610 may sense and amplify the data of the resistive storage cell SC by comparing the cell current Icell flowing through the first input terminal I1 and the reference current Iref flowing through the second input terminal I2. The operation of the comparison block 610 may be the same as the operation of the comparison block 310 of FIG. 3.

The clamp voltage generation block 620 may generate the clamp voltage VCLAMP and apply the clamp voltage VCLAMP to a first node NO1. The clamp voltage generation block 620 may include a current source 621, a coupling element 622, and a replica resistor cell 623. The current source 621 may generate a predetermined clamp current ICLAMP. The coupling element 622 has three terminals including a first terminal coupled to the current source 621, a second terminal coupled to the replica resistor cell 623, and a third terminal coupled to the first node NO1. Referring to FIG. 6, the third terminal coupled to the first node NO1 is the gate of coupling element 622 and the first terminal to which the current source 621 is coupled is also coupled to the first node NO1. The replica resistor cell 623 may be coupled between the second terminal of the coupling element 622 and a ground terminal. The replica resistor cell 623 may be modeled to have the same resistance value as the resistance value of the low resistance state of the variable resistance element R.

The voltage stabilization block 630 may stabilize the voltage of the first node NO1 in a charge period or a discharge period. The charge period may include a point of time when a read operation is started, and the discharge period may include a point of time when the read operation is ended. In some implementations, the charge period may include a predetermined period including a point of time when the read enable signal REN is activated, and the discharge period may include a predetermined period including a point of time when the read enable signal REN is deactivated.

The voltage stabilization block 630 may be coupled with the first node NO1 through the switching part PT. The switching part PT may be coupled to the first node NO1 at one end thereof, be coupled to the voltage stabilization block 630 at the other end thereof, and be inputted with a stabilization signal EQ through the gate thereof. For example, the switching part PT may include a transistor. The switching part PT may be turned on when the stabilization signal EQ is activated and be turned off when the stabilization signal EQ is deactivated. The stabilization signal EQ may be activated for the charge period and the discharge period. The voltage stabilization block 630 may be electrically coupled with the first node NO1 through the switching part PT for the charge period and the discharge period, and reduce the noise generated in the first node NO1. The exemplary structure of the voltage stabilization block 630 will be discussed later with regard to FIGS. 7 and 8.

If the noise generated in the clamp voltage VCLAMP is reduced in a read operation, a sensing standby time can be shortened. As a consequence, an operation speed can be increased, and, since an error due to noise is prevented, precision of operation can be enhanced.

Figure 7:
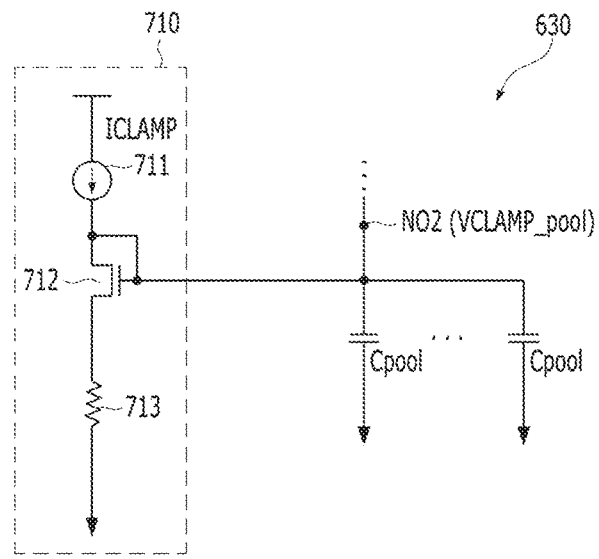
FIG. 7 is a configuration diagram illustrating a representation of an example of a voltage stabilization block 630 in accordance with one implementation of the patent document.

FIG. 7 is a configuration diagram illustrating a representation of an example of the voltage stabilization block 630 in accordance with one implementation of the patent document.

Referring to FIG. 7, the voltage stabilization block 630 may include a plurality of capacitors Cpool and a stabilization clamp voltage generation unit 710.

The stabilization clamp voltage generation unit 710 may include a current source 711, a coupling element 712, and a replica resistor cell 713. The current source 711 may generate a predetermined clamp current ICLAMP. The coupling element 712 has three terminals including a first terminal coupled to the current source 711, a second terminal coupled to the replica resistor cell 713, and a third gate terminal coupled to a second node NO2. The first terminal coupled to the current source is also coupled to the second node NO2. For example, the coupling element 712 may include a transistor. The replica resistor cell 713 may be coupled between the second terminal of the coupling element 712 and the ground terminal.

The plurality of capacitors Cpool may be coupled in parallel between the second node NO2 and the ground terminal. Each of the plurality of capacitors Cpool may be coupled to the second node NO2 at one end thereof, and be coupled to the ground terminal at the other end thereof. The stabilization clamp voltage generation unit 710 may generate a stabilization clamp voltage VCLAMP_pool having the voltage level that is the same as the clamp voltage VCLAMP, and apply the stabilization clamp voltage VCLAMP_pool to the second node NO2. The stabilization clamp voltage generation unit 710 may charge the second node NO2 to which the capacitors Cpool are coupled in parallel, with the stabilization clamp voltage VCLAMP_pool. Thereby, in the case where the first node NO1 and the second node NO2 are electrically coupled, the stabilization clamp voltage generation unit 710 may absorb quickly the noise generated in the first node NO1, and stabilize the voltage level of the first node NO1 to the voltage level of the stabilization clamp voltage VCLAMP_pool.

Figure 8:
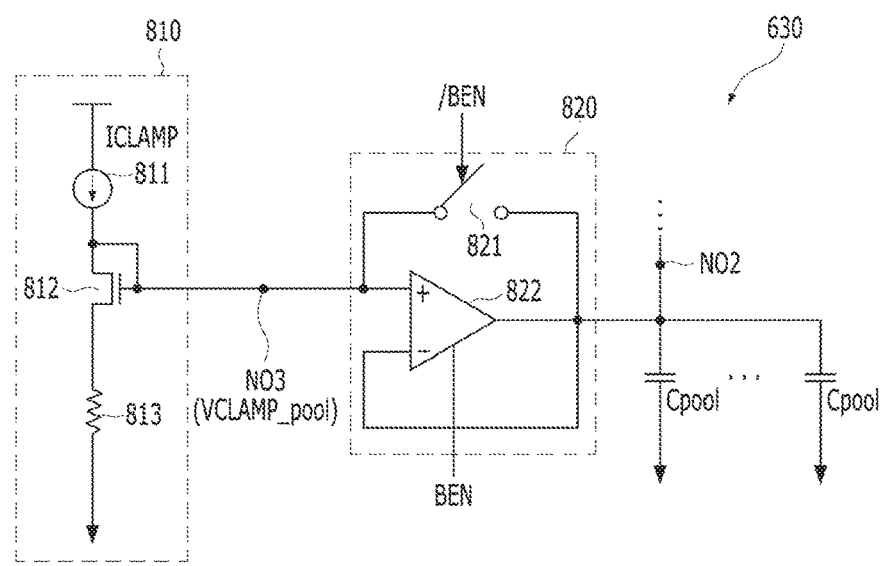
FIG. 8 is a configuration diagram illustrating a representation of an example of a voltage stabilization block 630 in accordance with one implementation of the patent document.

FIG. 8 is a configuration diagram illustrating a representation of an example of the voltage stabilization block 630 in accordance with one implementation of the disclosed technology in this patent document.

Referring to FIG. 8, the voltage stabilization block 630 may include a plurality of capacitors Cpool, a stabilization clamp voltage generation unit 810, and a coupling unit 820.

The stabilization clamp voltage generation unit 810 may include a current source 811, a coupling element 812, and a replica resistor cell 813. The current source 811 may generate a predetermined clamp current ICLAMP. The coupling element 812 has a first terminal which is coupled to the current source 811, and a second terminal which is coupled to the replica resistor cell 813. The gate of the coupling element 812 is coupled to a third node NO3. The first terminal of the current source 811 to which the current source 811 is coupled is also coupled to the third node NO3. For example, the coupling element 812 may include a transistor. The replica resistor cell 813 may be coupled between the second terminal and the ground terminal.

In the voltage stabilization block 630 of FIG. 8, the stabilization clamp voltage generation unit 810 may generate a stabilization clamp voltage VCLAMP_pool, and apply the stabilization clamp voltage VCLAMP_pool to the third node NO3. The voltage stabilization block 630 may further include the coupling unit 820 which couples a second node NO2 to the third node NO3.

The coupling unit 820 is connected between the second node NO2 and the third node NO3. The plurality of capacitors Cpool may be coupled in parallel between the second node NO2 and the ground terminal. Each of the plurality of capacitors Cpool is connected between the first end which is coupled to NO2 and the second end which is coupled to ground terminal. The coupling unit 820 may drive first ends of the plurality of capacitors Cpool depending on a comparison result of the voltage of the first ends of the plurality of capacitors Cpool, that is, the voltage of the second node NO2, with the stabilization clamp voltage VCLAMP_pool, that is, the voltage of the third node NO3, in the charge period or the discharge period. Further, the coupling unit 820 may transfer the stabilization clamp voltage VCLAMP_pool to the second node NO2 in a period other than the charge period or the discharge period.

The coupling unit 820 may include a switch element 821 and a driving element 822. The activation period of a control signal BEN may overlap partly or wholly with the activation period of the stabilization signal EQ. Also, the activation period of the control signal BEN may overlap partly or wholly with the charge period and the discharge period. The switch element 821 may be turned on in a period in which an inverted control signal /BEN is activated, and be turned off in a period in which the inverted control signal /BEN is deactivated.

In the case where the switch element 821 is turned on, the voltage of the third node NO3 may be transferred to the second node NO2 through the switch element 821 The driving element 822 may be enabled in a period in which the control signal BEN is activated, and pull-down drive the second node NO2 when the voltage of the second node NO2 is higher than the voltage of the third node NO3 and pull-up drive the second node NO2 when the voltage of the second node NO2 is lower than the voltage of the third node NO3. The driving element 822 may operate in the same manner as a source follower or a unit gain buffer. For reference, the inverted control signal /BEN and the control signal BEN may have opposite logic values.

The voltage stabilization block 630 of FIG. 8 may stabilize the voltage of the first node NO1 more quickly than the voltage stabilization block 630 of FIG. 7.

Figure 9:
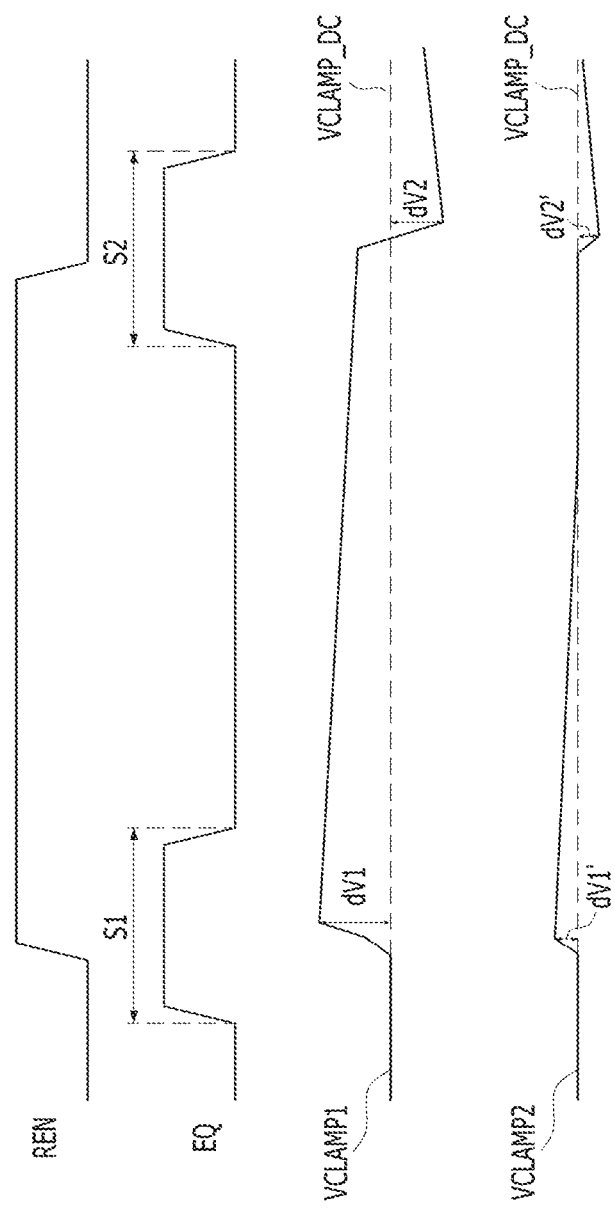
FIG. 9 is a representation of an example of a diagram to assist in the explanation of the waveform of a clamp voltage VCLAMP during a read operation in each of a case where the voltage stabilization block 630 is not provided and a case where the voltage stabilization block 630 is provided.

FIG. 9 is a representation of an example of a diagram to explain the waveform of the clamp voltage VCLAMP during a read operation in each of a case where the voltage stabilization block 630 is not provided and a case where the voltage stabilization block 630 is provided.

VCLAMP1 represents the waveform of the clamp voltage VCLAMP in a read operation in the case where the voltage stabilization block 630 is not provided, and VCLAMP2 represents the waveform of the clamp voltage VCLAMP in a read operation in the case where the voltage stabilization block 630 is provided.

The stabilization signal EQ may be activated in a predetermined charge period S1 and a predetermined discharge period S2. The read enable signal REN may be activated in the charge period S1 and be deactivated in the discharge period S2. When observing the waveform VCLAMP1, it may be seen that, in the case where the voltage stabilization block 630 is not provided, due to the noise generated in the first node NO1, the clamp voltage VCLAMP increases by a large amount dV1 in comparison with a DC value VCLAMP_DC during the charge period S1 and decreases by a large amount dV2 in comparison with the DC value VCLAMP_DC during the discharge period S2. When observing the waveform VCLAMP2, it may be seen that, in the case where the voltage stabilization block 630 is provided, since the voltage stabilization block 630 discharges the charges of the first node NO1 in the charge period S1 and charges the charges of the first node NO1 in the discharge period S2, the clamp voltage VCLAMP changes by small amounts dV1' and dV2' from the DC value VCLAMP_DC during the charge period S1 and the discharge period S2.

Figure 10:
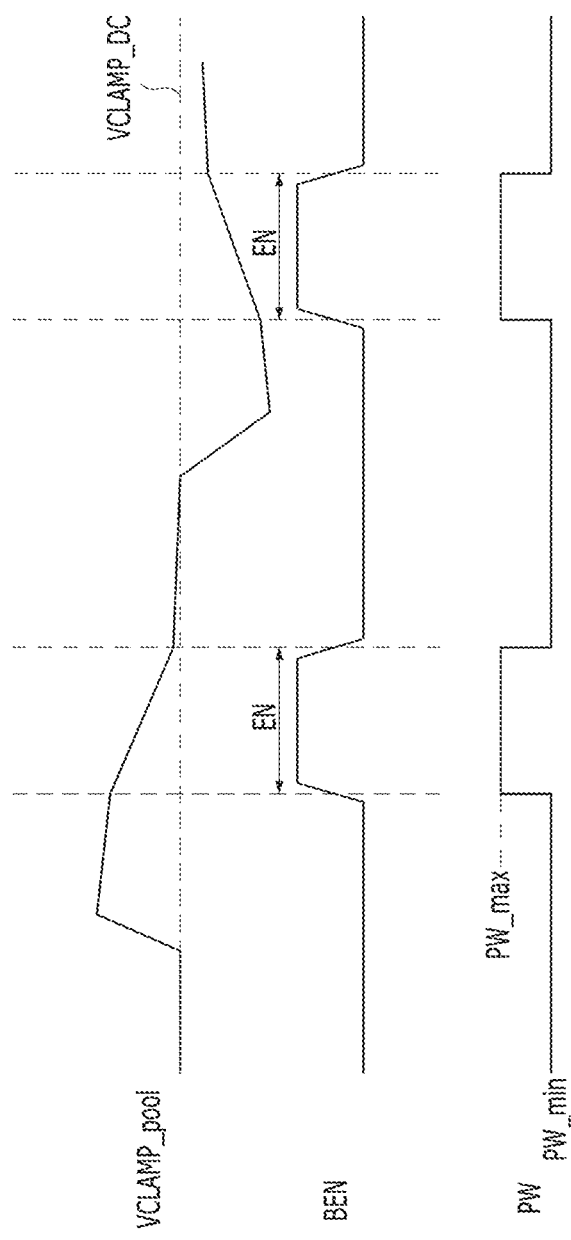
FIG. 10 is a representation of an example of a diagram to assist in the explanation of the operation of the voltage stabilization block 630 shown in FIG. 6.

FIG. 10 is a representation of an exemplary diagram to explain the operation of the voltage stabilization block 630 shown in FIG. 8.

Referring to FIG. 10, the stabilization clamp voltage generation unit 810 may generate the stabilization clamp voltage VCLAMP_pool, and apply the stabilization clamp voltage VCLAMP_pool to the third node NO3. As the driving element 822 is enabled in a period EN in which the control signal BEN is activated, the driving element 822 may pull-up drive the second node NO2 since the voltage of the second node NO2 is lower than the voltage of the third node NO3. Accordingly, the voltage level of the second node NO2 may converge rapidly to the voltage level of the stabilization clamp voltage VCLAMP_pool. As the switch element 821 is turned on in a period in which the inverted control signal /BEN is activated, the voltage of the third node NO3 may be transferred to the second node NO2 through the switch element 821. As a result, power PW used in the voltage stabilization block 630 may become a maximum value PW_max only in the period EN in which the control signal BEN is activated, and may be retained as a minimum value PW_min in other periods than the period EN. That is to say, if the control signal BEN is activated, the voltage of the second node NO2 may be controlled to or retained at the voltage level of the stabilization clamp voltage VCLAMP_pool, and if the control signal BEN is deactivated, the driving element 822 may be deactivated to minimize power consumption.

Figure 11:
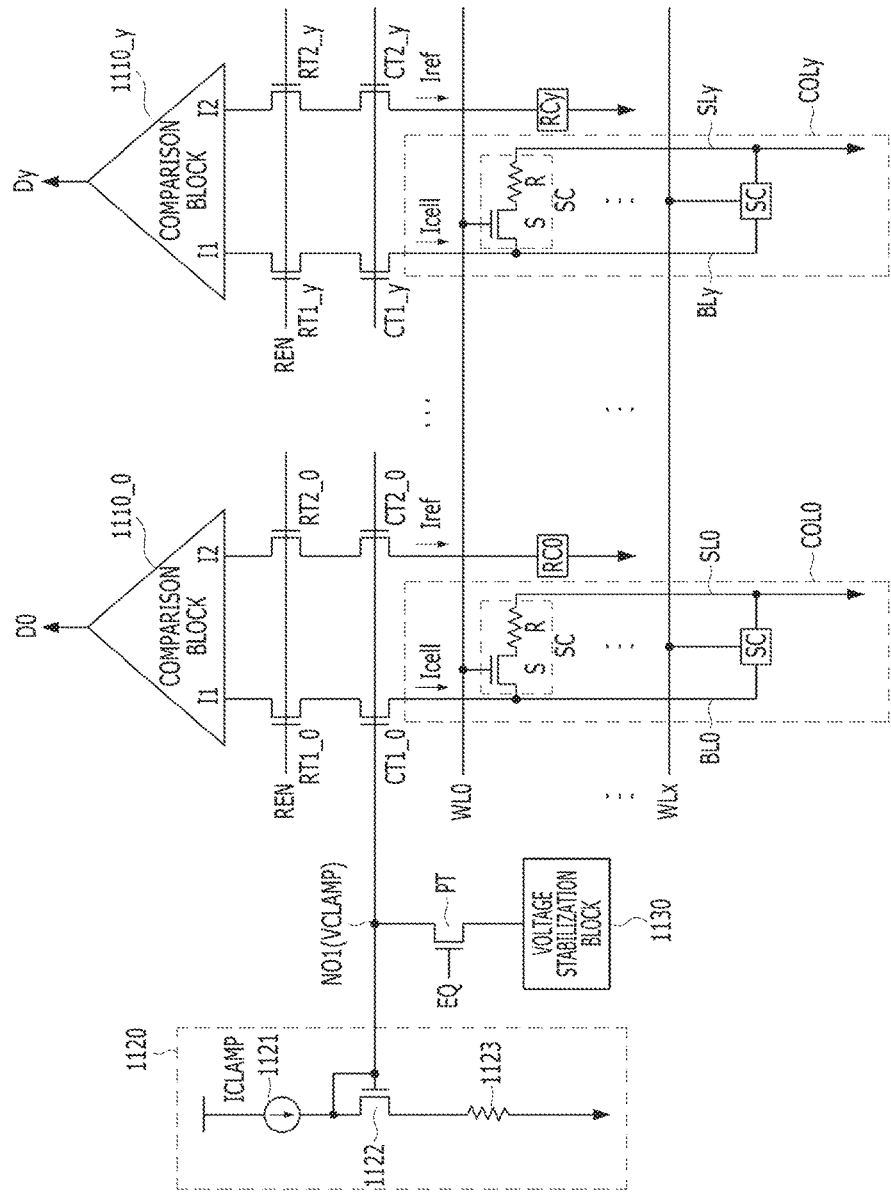
FIG. 11 is a configuration diagram illustrating a representation of an example of a memory circuit (device) including variable resistance elements.

FIG. 11 is a configuration diagram illustrating a representation of an example of a memory circuit (device) including variable resistance elements.

Referring to FIG. 11, the memory circuit (device) may include a plurality of columns COL0 to COLy (y is a natural number), a plurality of reference resistance cells RC0 to RCy, a plurality of comparison blocks 1110_0 to 1110_y, a clamp voltage generation block 1120, a voltage stabilization block 1130, a plurality of first read enable parts RT1_0 to RT1_y, a plurality of second read enable parts RT2_0 to RT2_y, a plurality of first clamp parts CT1_0 to CT1_y, a plurality of second clamp parts CT2_0 to CT2_y, and a switching part PT.

Each of the plurality of first clamp parts CT1_0 to CT1_y may be coupled between a bit line BL of a corresponding column among the plurality of columns COL0 to COLy and a first input terminal I1 of a corresponding comparison block among the plurality of comparison blocks 1110_0 to 1110_y, and may control the maximum current amount of a cell current Icell depending on the voltage level of a clamp voltage VCLAMP. For example, the each of the first clamp parts CT1_0 to CT1_y may be composed of a transistor having a gate coupled to a node NO1 to which the clamp voltage VCLAMP is applied from clamp voltage generation block 1120. Each of the plurality of second clamp parts CT2_0 to CT2_y may be coupled between one end of a corresponding reference resistance cell among the plurality of reference resistance cells RC0 to RCy and a second input terminal I2 of a corresponding comparison block among the plurality of comparison blocks 1110_0 to 1110_y, and may control the maximum current amount of a reference current Iref depending on the voltage level of the clamp voltage VCLAMP. For example, each of the second clamp parts CT2_0 to CT2_y may be composed of a transistor having a gate coupled to the node NO1 to which the clamp voltage VCLAMP is applied from clamp voltage generation block 1120.

The plurality of columns COL0 to COLy may include a plurality of resistive storage cells SC, bit lines BL0 to BLy which are coupled to one ends of the plurality of resistive storage cells SC, and source lines SL0 to SLy which are coupled to the other ends of the plurality of resistive storage cells SC.

The clamp voltage generation block 1120 may include a current source 1121 which generates a predetermined clamp current ICLAMP, a replica resistor cell, a transistor 1122 including three terminals. The first terminal of the transistor 1122 is coupled to the current source 1121, the second terminal of the transistor 1122 is coupled to the replica resistor cell 1123, and the third terminal which is gate of the transistor 1122 is coupled to the node NO1. The first terminal and the third terminal of the transistor 1122 are coupled to each other. The replica resistor cell 1123 may be modeled to have the same resistance value as the resistance value of the low resistance state of a variable resistance element R of the resistive storage cell SC.

Figure 12:
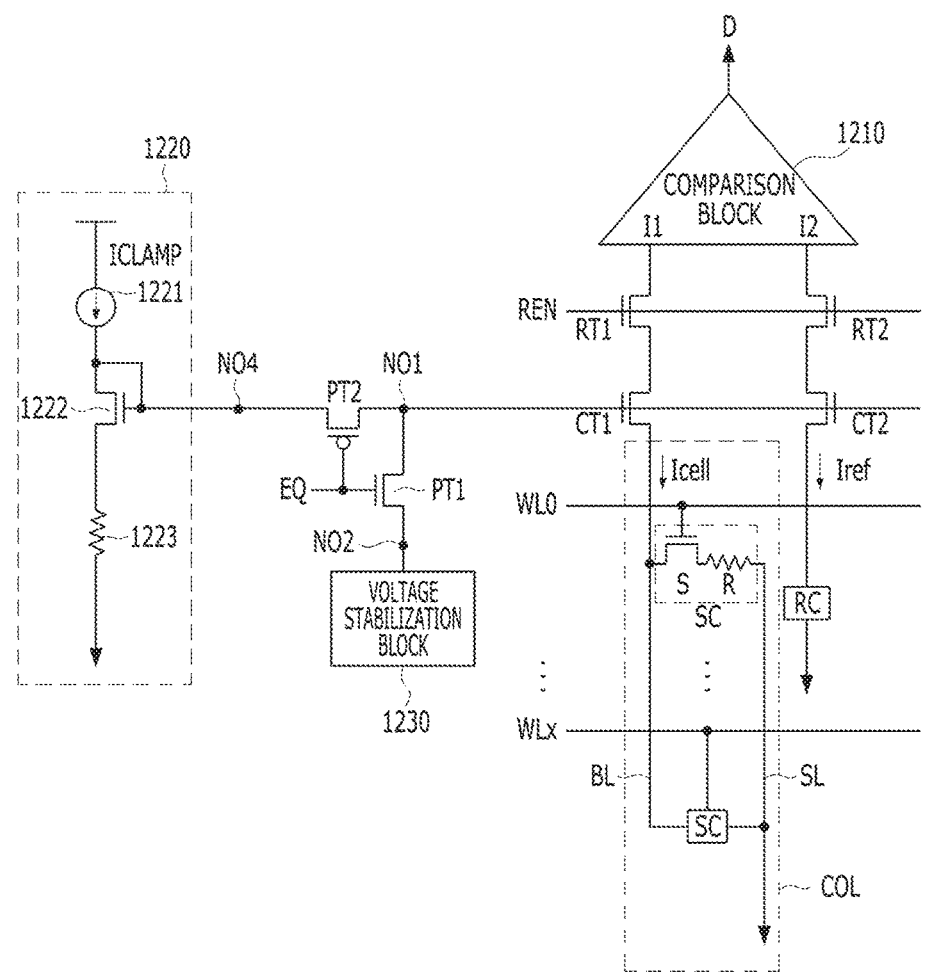
FIG. 12 is a configuration diagram illustrating a representation of an example of a memory circuit (device) including variable resistance elements.

FIG. 12 is a configuration diagram illustrating a representation of an example of a memory circuit (device) including variable resistance elements.

Referring to FIG. 12, the memory circuit (device) may include a plurality of resistive storage cells SC, a reference resistance cell RC, a comparison block 1210, a clamp voltage generation block 1220, a voltage stabilization block 1230, first and second read enable parts RT1 and RT2, first and second clamp parts CT1 and CT2, and first and second switching parts PT1 and PT2.

The first switching part PT1 may electrically couple a node NO1 and the voltage stabilization block 1230 in a charge period or a discharge period. For example, the first switching part PT1 may include a transistor. The second switching part PT2 may be coupled between nodes NO1 and NO4, and be turned on in a period other than the charge period and the discharge period. For example, the second switching part PT2 may include a transistor.

The clamp voltage generation block 1220 may generate a clamp voltage VCLAMP, and apply the clamp voltage VCLAMP to the node NO4. The clamp voltage generation block 1220 may include a current source 1221 which generates a predetermined clamp current ICLAMP, a replica resistor cell 1223, and a coupling element 1222. The coupling element 1222 has three terminals including a first terminal coupled to the current source 1221, a second terminal coupled to the replica resistor cell 1223, and a third gate terminal coupled to the node NO4. The first terminal of the coupling element 1222 is also coupled to the third gate terminal. The replica resistor cell 1223 may be modeled to have the same resistance value as the resistance value of the low resistance state of a variable resistance element R of the resistive storage cell SC.

The voltage stabilization block 1230 may stabilize the voltage of the node NO1 in the charge period or the discharge period. The charge period may include a point of time when a read operation is started, and the discharge period may include a point of time when the read operation is ended. In some implementations, the charge period may include a point of time when a read enable signal REN is activated, and the discharge period may include a point of time when the read enable signal REN is deactivated.

The voltage stabilization block 1230 may be coupled with the node NO1 through the first switching part PT1. The first switching part PT1 may have a first terminal coupled to the node NO1, and a second terminal coupled to the voltage stabilization block 1230. The first switching part PT1 may be turned on in the case where a stabilization signal EQ is activated and be turned off in the case where the stabilization signal EQ is deactivated. The stabilization signal EQ may be activated for the charge period and the discharge period. The voltage stabilization block 1230 may be electrically coupled with the node NO1 through the first switching part PT1 in the charge period and the discharge period, and reduce the noise generated in the node NO1.

The second switching part PT2 may be turned off and decouple the node NO1 and the node NO4 in the case where the stabilization signal EQ is activated, and may be turned on and electrically couple the node NO1 and the node NO4 in the case where the stabilization signal EQ is deactivated.

Figure 13:
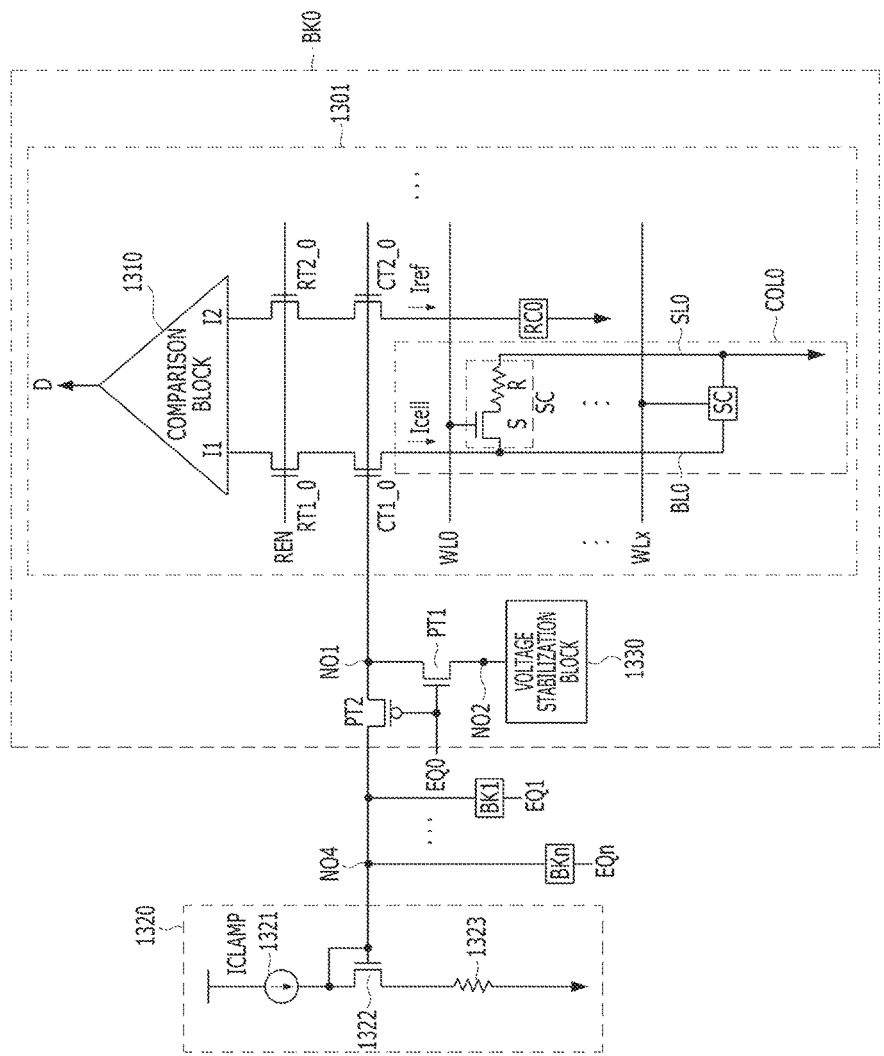
FIG. 13 is a configuration diagram illustrating a representation of an example of a memory circuit (device) including variable resistance elements.

FIG. 13 is a configuration diagram illustrating a representation of an example of a memory circuit (device) including variable resistance elements.

Referring to FIG. 13, the memory circuit (device) may include a clamp voltage generation block 1320 and a plurality of memory banks BK0 to BKn (n is a natural number). In FIG. 13, for the sake of convenience in illustration, the internal configuration of only the memory bank BK0 is illustrated, and the internal configurations of the remaining memory banks BK1 to BKn are omitted. The configurations and operations of the memory banks BK1 to BKn may be the same as the configuration and operation of the memory bank BK0.

Each of the memory banks BK0 to BKn may include an array 1301, a voltage stabilization block 1302, and first and second switching parts PT1 and PT2. The array 1301 may include a plurality of columns COL0 to COLy (y is a natural number), a plurality of reference resistance cells RC0 to RCy, a plurality of comparison blocks 1110_0 to 1110_y, a plurality of first read enable parts RT1_0 to RT1_y, a plurality of second read enable parts RT2_0 to RT2_y, a plurality of first clamp parts CT1_0 to CT1_y, and a plurality of second clamp parts CT2_0 to CT2_y, as described above with reference to FIG. 11.

The configuration and operation of the voltage stabilization block 1302 may be the same as the configuration and operation of the voltage stabilization block 630 described above with reference to FIG. 6.

The voltage stabilization block 1302 may be coupled with a node NO1 through the first switching part PT1. The first switching part PT1 may have a first terminal coupled to the node NO1, and a second terminal coupled to the voltage stabilization block 1302. The first switching part PT1 may be turned on in the case where a stabilization signal EQ0 is activated and be turned off in the case where the stabilization signal EQ0 is deactivated. The stabilization signal EQ0 may be activated in a charge period and a discharge period. The voltage stabilization block 1302 may be electrically coupled with the node NO1 through the first switching part PT1 in the charge period and the discharge period, and reduce the noise generated in the node NO1.

The second switching part PT2 may be turned off and decouple the node NO1 and a node NO4 in the case where the stabilization signal EQ0 is activated, and may be turned on and electrically couple the node NO1 and the node NO4 in the case where the stabilization signal EQ0 is deactivated.

The clamp voltage generation block 1320 may generate a clamp voltage VCLAMP, and apply the clamp voltage VCLAMP to the node NO4. The clamp voltage generation block 1320 may include a current source 1321 which generates a predetermined clamp current ICLAMP, a coupling element 1322, and a replica resistor cell 1323. In The coupling element 1322 may have three terminals including a first terminal coupled to the current source 1321, a second terminal coupled to a replica resistor cell 1323, and a third terminal coupled to the node NO4. As shown in FIG. 13, the first terminal and the third terminal are coupled to each other. The replica resistor cell 1323 may be modeled to have the same resistance value as the resistance value of the low resistance state of a variable resistance element R of a resistive storage cell SC.

Each of the plurality of banks BK0 to BKn may operate in response to a corresponding stabilization signal among a plurality of stabilization signals EQ0 to EQn, and a stabilization signal (for example, EQ1) corresponding to a bank (for example, BK1) selected among the plurality of banks BK0 to BKn may be activated or deactivated in the same manner as the stabilization signal EQ described above with reference to FIG. 6. Stabilization signals (for example, EQ0 and EQ2 to EQn) corresponding to banks (for example, BK0 and BK2 to BKn) not selected among the plurality of banks BK0 to BKn may be retained in a deactivated state. If the stabilization signal of the selected bank is activated, because the second switching part PT2 is turned off and thus electrical coupling to the node NO1 is cut off, it is possible to prevent the noise generated due to the operation of the selected bank from being transferred to the other banks.

The above and other memory circuits or semiconductor devices based on the disclosed technology may be used in a range of devices or systems. FIGS. 14-18 provide some examples of devices or systems that may implement the memory circuits disclosed herein.

Figure 14:
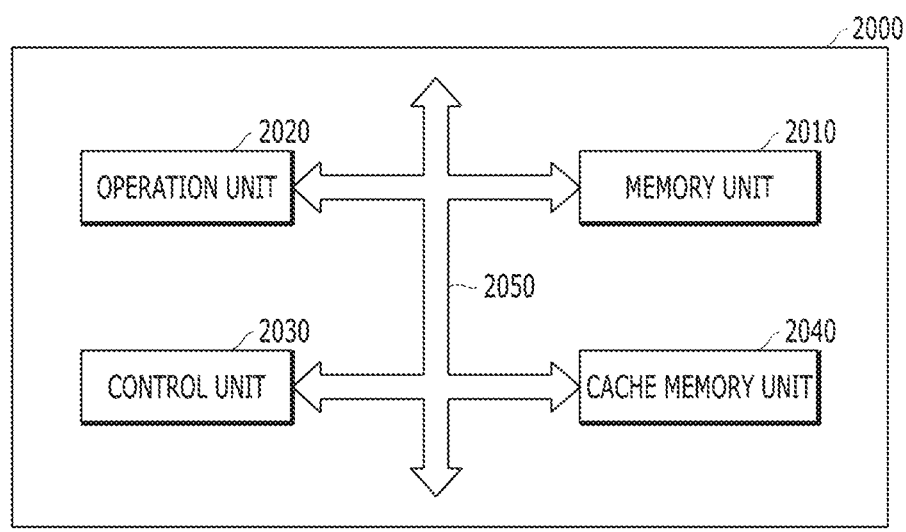
FIG. 14 is an example of configuration diagram of a microprocessor implementing memory circuitry based on the disclosed technology.

FIG. 14 is an example of configuration diagram of a microprocessor implementing memory circuitry based on the disclosed technology.

Referring to FIG. 14, a microprocessor 2000 may perform tasks for controlling and tuning a series of processes of receiving data from various external devices, processing the data, and outputting processing results to external devices. The microprocessor 2000 may include a memory unit 2010, an operation unit 2020, a control unit 2030, and so on. The microprocessor 2000 may be various data processing units such as a central processing unit (CPU), a graphic processing unit (GPU), a digital signal processor (DSP) and an application processor (AP).

The memory unit 2010 is a part which stores data in the microprocessor 2000, as a processor register, or the like. The memory unit 2010 may include a data register, an address register, a floating point register and so on. Besides, the memory unit 2010 may include various registers. The memory unit 2010 may perform the function of temporarily storing data for which operations are to be performed by the operation unit 2020, result data of performing the operations and addresses where data for performing of the operations are stored.

The memory unit 2010 may include one or more of the above-described semiconductor devices in accordance with the implementations. For example, the memory unit 2010 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the memory unit 2010 may be improved. As a consequence, performance characteristics of the microprocessor 2000 may be improved.

The operation unit 2020 may perform four arithmetical operations or logical operations according to results that the control unit 2030 decodes commands. The operation unit 2020 may include at least one arithmetic logic unit (ALU) and so on.

The control unit 2030 may receive signals from the memory unit 2010, the operation unit 2020 and an external device of the microprocessor 2000, perform extraction, decoding of commands, and controlling input and output of signals of the microprocessor 2000, and execute processing represented by programs.

The microprocessor 2000 according to the present implementation may additionally include a cache memory unit 2040 which can temporarily store data to be inputted from an external device other than the memory unit 2010 or to be outputted to an external device. In this case, the cache memory unit 2040 may exchange data with the memory unit 2010, the operation unit 2020 and the control unit 2030 through a bus interface 2050.

Figure 15:
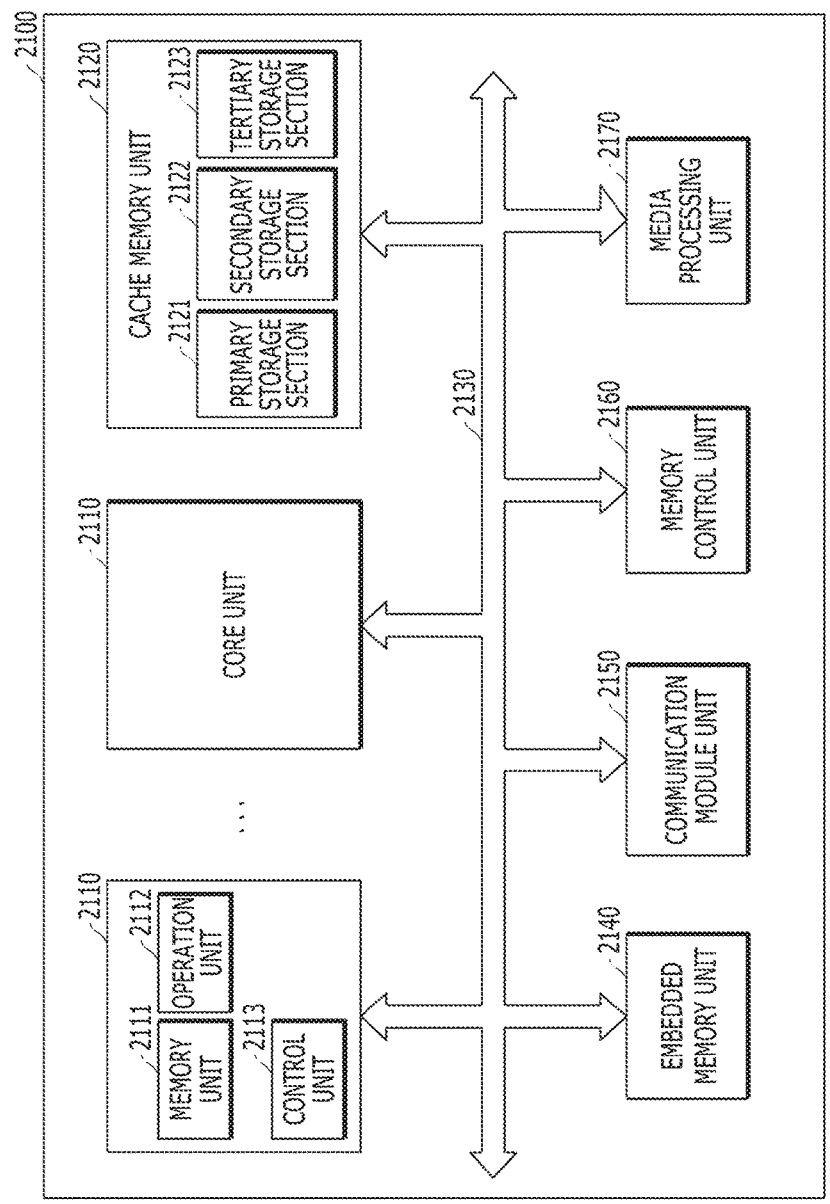
FIG. 15 is an example of configuration diagram of a processor implementing memory circuitry based on the disclosed technology.

FIG. 15 is an example of configuration diagram of a processor implementing memory circuitry based on the disclosed technology.

Referring to FIG. 15, a processor 2100 may improve performance and realize multi-functionality by including various functions other than those of a microprocessor which performs tasks for controlling and tuning a series of processes of receiving data from various external devices, processing the data, and outputting processing results to external devices. The processor 2100 may include a core unit 2110 which serves as the microprocessor, a cache memory unit 2120 which serves to storing data temporarily, and a bus interface 2130 for transferring data between internal and external devices. The processor 2100 may include various system-on-chips (SoCs) such as a multi-core processor, a graphic processing unit (GPU) and an application processor (AP).

The core unit 2110 of the present implementation is a part which performs arithmetic logic operations for data inputted from an external device, and may include a memory unit 2111, an operation unit 2112 and a control unit 2113.

The memory unit 2111 is a part which stores data in the processor 2100, as a processor register, a register or the like. The memory unit 2111 may include a data register, an address register, a floating point register and so on. Besides, the memory unit 2111 may include various registers. The memory unit 2111 may perform the function of temporarily storing data for which operations are to be performed by the operation unit 2112, result data of performing the operations and addresses where data for performing of the operations are stored. The operation unit 2112 is a part which performs operations in the processor 2100. The operation unit 2112 may perform four arithmetical operations, logical operations, according to results that the control unit 2113 decodes commands, or the like. The operation unit 2112 may include at least one arithmetic logic unit (ALU) and so on. The control unit 2113 may receive signals from the memory unit 2111, the operation unit 2112 and an external device of the processor 2100, perform extraction, decoding of commands, controlling input and output of signals of processor 2100, and execute processing represented by programs.

The cache memory unit 2120 is a part which temporarily stores data to compensate for a difference in data processing speed between the core unit 2110 operating at a high speed and an external device operating at a low speed. The cache memory unit 2120 may include a primary storage section 2121, a secondary storage section 2122 and a tertiary storage section 2123. In general, the cache memory unit 2120 includes the primary and secondary storage sections 2121 and 2122, and may include the tertiary storage section 2123 in the case where high storage capacity is required. As the occasion demands, the cache memory unit 2120 may include an increased number of storage sections. That is to say, the number of storage sections which are included in the cache memory unit 2120 may be changed according to a design. The speeds at which the primary, secondary and tertiary storage sections 2121, 2122 and 2123 store and discriminate data may be the same or different. In the case where the speeds of the respective storage sections 2121, 2122 and 2123 are different, the speed of the primary storage section 2121 may be largest. At least one storage section of the primary storage section 2121, the secondary storage section 2122 and the tertiary storage section 2123 of the cache memory unit 2120 may include one or more of the above-described semiconductor devices in accordance with the implementations. For example, the cache memory unit 2120 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the cache memory unit 2120 may be improved. As a consequence, performance characteristics of the processor 2100 may be improved.

Although it was shown in FIG. 15 that all the primary, secondary and tertiary storage sections 2121, 2122 and 2123 are configured inside the cache memory unit 2120, it is to be noted that all the primary, secondary and tertiary storage sections 2121, 2122 and 2123 of the cache memory unit 2120 may be configured outside the core unit 2110 and may compensate for a difference in data processing speed between the core unit 2110 and the external device. Meanwhile, it is to be noted that the primary storage section 2121 of the cache memory unit 2120 may be disposed inside the core unit 2110 and the secondary storage section 2122 and the tertiary storage section 2123 may be configured outside the core unit 2110 to strengthen the function of compensating for a difference in data processing speed. In another implementation, the primary and secondary storage sections 2121, 2122 may be disposed inside the core units 2110 and tertiary storage sections 2123 may be disposed outside core units 2110.

The bus interface 2130 is a part which connects the core unit 2110, the cache memory unit 2120 and external device and allows data to be efficiently transmitted.

The processor 2100 according to the present implementation may include a plurality of core units 2110, and the plurality of core units 2110 may share the cache memory unit 2120. The plurality of core units 2110 and the cache memory unit 2120 may be directly connected or be connected through the bus interface 2130. The plurality of core units 2110 may be configured in the same way as the above-described configuration of the core unit 2110. In the case where the processor 2100 includes the plurality of core unit 2110, the primary storage section 2121 of the cache memory unit 2120 may be configured in each core unit 2110 in correspondence to the number of the plurality of core units 2110, and the secondary storage section 2122 and the tertiary storage section 2123 may be configured outside the plurality of core units 2110 in such a way as to be shared through the bus interface 2130. The processing speed of the primary storage section 2121 may be larger than the processing speeds of the secondary and tertiary storage section 2122 and 2123. In another implementation, the primary storage section 2121 and the secondary storage section 2122 may be configured in each core unit 2110 in correspondence to the number of the plurality of core units 2110, and the tertiary storage section 2123 may be configured outside the plurality of core units 2110 in such a way as to be shared through the bus interface 2130.

The processor 2100 according to the present implementation may further include an embedded memory unit 2140 which stores data, a communication module unit 2150 which can transmit and receive data to and from an external device in a wired or wireless manner, a memory control unit 2160 which drives an external memory device, and a media processing unit 2170 which processes the data processed in the processor 2100 or the data inputted from an external input device and outputs the processed data to an external interface device and so on. Besides, the processor 2100 may include a plurality of various modules and devices. In this case, the plurality of modules which are added may exchange data with the core units 2110 and the cache memory unit 2120 and with one another, through the bus interface 2130.

The embedded memory unit 2140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 2150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 2160 is to administrate and process data transmitted between the processor 2100 and an external storage device operating according to a different communication standard. The memory control unit 2160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 2170 may process the data processed in the processor 2100 or the data inputted in the forms of image, voice and others from the external input device and output the data to the external interface device. The media processing unit 2170 may include a graphic processing unit (GPU), a digital signal processor (DSP), a high definition audio device (HD audio), a high definition multimedia interface (HDMI) controller, and so on.

Figure 16:
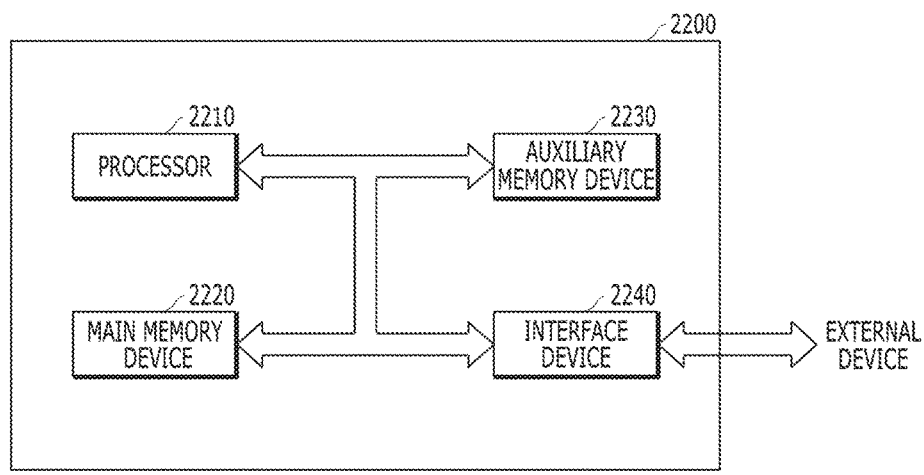
FIG. 16 is an example of configuration diagram of a system implementing memory circuitry based on the disclosed technology.

FIG. 16 is an example of configuration diagram of a system implementing memory circuitry based on the disclosed technology.

Referring to FIG. 16, a system 2200 as an apparatus for processing data may perform input, processing, output, communication, storage, etc. to conduct a series of manipulations for data. The system 2200 may include a processor 2210, a main memory device 2220, an auxiliary memory device 2230, an interface device 2240, and so on. The system 2200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 2210 may decode inputted commands and processes operation, comparison, etc. for the data stored in the system 2200, and controls these operations. The processor 2210 may include a microprocessor unit (MPU), a central processing unit (CPU), a single/multi-core processor, a graphic processing unit (GPU), an application processor (AP), a digital signal processor (DSP), and so on.

The main memory device 2220 is a storage which may temporarily store, call and execute program codes or data from the auxiliary memory device 2230 when programs are executed and can conserve memorized contents even when power supply is cut off. The main memory device 2220 may include one or more of the above-described semiconductor devices in accordance with the implementations. For example, the main memory device 2220 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the main memory device 2220 may be improved. As a consequence, performance characteristics of the system 2200 may be improved.

Also, the main memory device 2220 may further include a static random access memory (SRAM), a dynamic random access memory (DRAM), and so on, of a volatile memory type in which all contents are erased when power supply is cut off. Unlike this, the main memory device 2220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 2230 is a memory device for storing program codes or data. While the speed of the auxiliary memory device 2230 is slower than the main memory device 2220, the auxiliary memory device 2230 can store a larger amount of data. The auxiliary memory device 2230 may include one or more of the above-described semiconductor devices in accordance with the implementations. For example, the auxiliary memory device 2230 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the auxiliary memory device 2230 may be improved. As a consequence, performance characteristics of the system 2200 may be improved.

Also, the auxiliary memory device 2230 may further include a data storage system (see the reference numeral 2300 of FIG. 17) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 2230 may not include the semiconductor devices according to the implementations, but may include data storage systems (see the reference numeral 2300 of FIG. 17) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 2240 may be to perform exchange of commands and data between the system 2200 of the present implementation and an external device. The interface device 2240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 17:
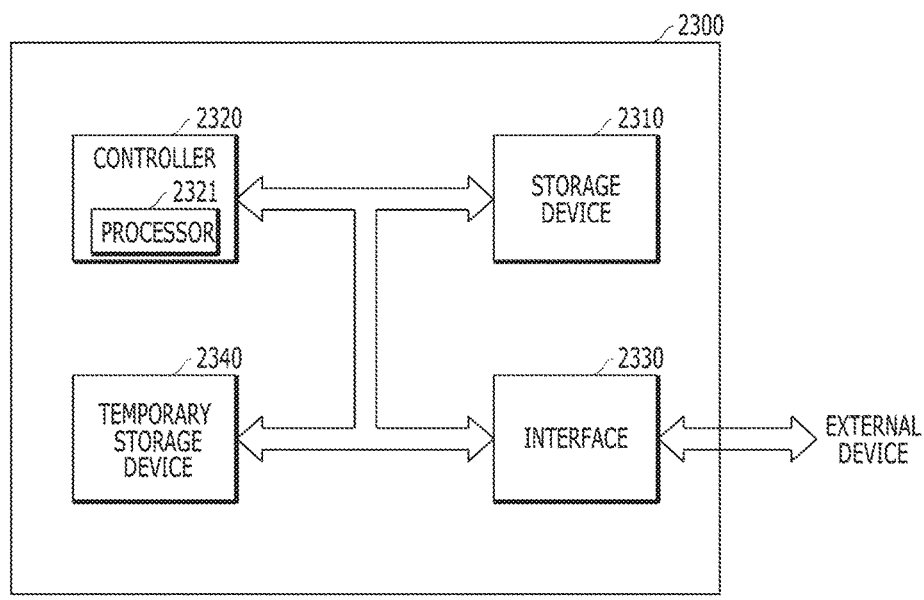
FIG. 17 is an example of configuration diagram of a data storage system implementing memory circuitry based on the disclosed technology.

FIG. 17 is an example of configuration diagram of a data storage system implementing memory circuitry based on the disclosed technology.

Referring to FIG. 17, a data storage system 2300 may include a storage device 2310 which has a nonvolatile characteristic as a component for storing data, a controller 2320 which controls the storage device 2310, an interface 2330 for connection with an external device, and a temporary storage device 2340 for storing data temporarily. The data storage system 2300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 2310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 2320 may control exchange of data between the storage device 2310 and the interface 2330. To this end, the controller 2320 may include a processor 2321 for performing an operation for, processing commands inputted through the interface 2330 from an outside of the data storage system 2300 and so on.

The interface 2330 is to perform exchange of commands and data between the data storage system 2300 and the external device. In the case where the data storage system 2300 is a card type, the interface 2330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 2300 is a disk type, the interface 2330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 2330 may be compatible with one or more interfaces having a different type from each other.

The temporary storage device 2340 can store data temporarily for efficiently transferring data between the interface 2330 and the storage device 2310 according to diversifications and high performance of an interface with an external device, a controller and a system. The temporary storage device 2340 for temporarily storing data may include one or more of the above-described semiconductor devices in accordance with the implementations. For example, the temporary storage device 2340 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the temporary storage device 2340 may be improved. As a consequence, performance characteristics of the system 2300 may be improved.

Figure 18:
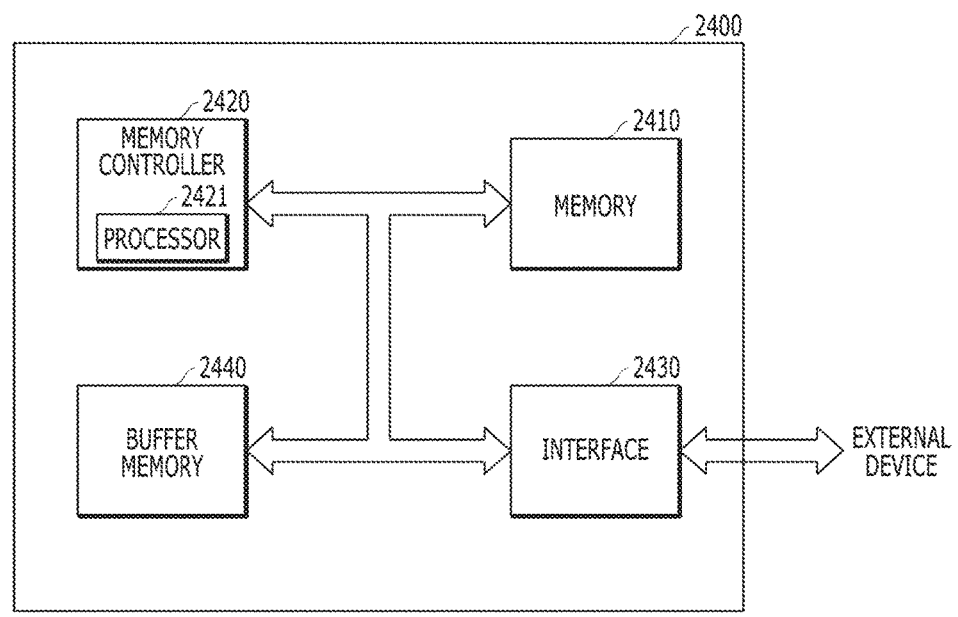
FIG. 18 is an example of configuration diagram of a memory system implementing memory circuitry based on the disclosed technology.

FIG. 18 is an example of configuration diagram of a memory system implementing memory circuitry based on the disclosed technology.

Referring to FIG. 18, a memory system 2400 may include a memory 2410 which has a nonvolatile characteristic as a component for storing data, a memory controller 2420 which controls the memory 2410, an interface 2430 for connection with an external device, and so on. The memory system 2400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 2410 for storing data may include one or more of the above-described semiconductor devices in accordance with the implementations. For example, the memory 2410 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the memory 2410 may be improved. As a consequence, performance characteristics of the microprocessor 2400 may be improved.

Through this, the performance of the memory system 2400 may be improved by performing a stable sense and amplification operation.

Also, the memory 2410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 2420 may control exchange of data between the memory 2410 and the interface 2430. To this end, the memory controller 2420 may include a processor 2421 for performing an operation for and processing commands inputted through the interface 2430 from an outside of the memory system 2400.

The interface 2430 is to perform exchange of commands and data between the memory system 2400 and the external device. The interface 2430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 2430 may be compatible with one or more interfaces having a different type from each other.

The memory system 2400 according to the present implementation may further include a buffer memory 2440 for efficiently transferring data between the interface 2430 and the memory 2410 according to diversification and high performance of an interface with an external device, a memory controller and a memory system. For example, the buffer memory 2440 for temporarily storing data may include one or more of the above-described semiconductor devices in accordance with the implementations. The buffer memory 2440 may include a plurality of resistive storage cells; a reference resistance cell; a comparison block suitable for comparing a cell current of a first input terminal and a reference current of a second input terminal; a first clamp part coupled between one ends of the plurality of resistive storage cells and the first input terminal, and suitable for controlling a maximum current amount of the cell current depending on a voltage level of a first node; a second clamp part coupled between one end of the reference resistance cell and the second input terminal, and suitable for controlling a maximum current amount of the reference current depending on the voltage level of the first node; a voltage stabilization block suitable for stabilizing a voltage of the first node in a charge period or a discharge period; and a switching part suitable for electrically coupling the first node and the voltage stabilization block in the charge period or the discharge period. Through this, characteristics of the buffer memory 2440 may be improved. As a consequence, performance characteristics of the microprocessor 2400 may be improved.

Moreover, the buffer memory 2440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 2440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 14-18 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device including a semiconductor memory, wherein the semiconductor memory comprises:
    a plurality of resistive storage cells each structured to exhibit different resistance values for storing data;
    a reference resistance cell;
    a comparison block electrically coupled to the plurality of resistive storage cells through a first input terminal and the reference resistance cell through a second input terminal, the comparison block operable to compare a cell current flowing through the first input terminal and a reference current flowing through the second input terminal;
    a first clamp part having terminals including a first terminal coupled to the plurality of resistive storage cells, a second terminal coupled to the first input terminal, and a third terminal coupled to a first node, and operable to control a maximum current amount of the cell current depending on a voltage level of the first node;
    a second clamp part coupled between the reference resistance cell and the second input terminal, and operable to control a maximum current amount of the reference current depending on the voltage level of the first node;
    a voltage stabilization block electrically coupled to the first clamp part through the first node and operable to stabilize a voltage of the first node during a charging or a discharging period; and
    a switching part electrically coupled with the first node and the voltage stabilization block in the charging period or the discharging period.

2. The electronic device of claim 1, wherein the semiconductor memory further comprises:
    a clamp voltage generation block coupled to the first node and operable to generate a clamp voltage and apply the generated clamp voltage to the first node.

3. The electronic device of claim 2, wherein the voltage stabilization block comprises:
    a plurality of capacitors coupled in parallel; and
    a stabilization clamp voltage generation unit coupled to first ends of the capacitors and operable to generate a stabilization clamp voltage which has the same level as the clamp voltage, and apply the stabilization clamp voltage to the first ends the plurality of capacitors.

4. The electronic device of claim 2, wherein the voltage stabilization block comprises:
- a plurality of capacitors coupled in parallel;
- a stabilization clamp voltage generation unit operable to generate a stabilization clamp voltage which has the same level as the clamp voltage; and
- a coupling unit coupled between the stabilization clamp voltage generation unit and first ends of the capacitors and operable to drive the capacitors depending on a comparison result of a voltage across the capacitors and the stabilization clamp voltage, in the charging period or the discharging period.

5. The electronic device of claim 1, wherein the charging period includes a point of time when a read operation is started, and the discharging period includes a point of time when the read operation is ended.

6. The electronic device of claim 1, wherein the comparison block senses data of a resistive storage cell selected among the plurality of resistive storage cells, by comparing the cell current and the reference current.

7. The electronic device of claim 1, wherein the semiconductor memory further comprises:
- a bit line to which the first terminals of the plurality of resistive storage cells are coupled, wherein the bit line is coupled with the first clamp part; and
- a source line to which second terminals of the plurality of resistive storage cells are coupled.

8. The electronic device of claim 7, wherein the semiconductor memory further comprises:
- a plurality of additional resistive storage cells each structured to exhibit different resistance values for storing data;
- an additional reference resistance cell;
- an additional comparison block electrically coupled to the plurality of additional resistive storage cells through a third input terminal and the additional reference resistance cell through a fourth input terminal, the additional comparison block operable to compare a corresponding cell current flowing through the third input terminal and a corresponding reference current flowing through the fourth input terminal;
- an additional first clamp part having terminals including a first terminal coupled to the plurality of additional resistive storage cells, a second terminal coupled to the third input terminal, and a third terminal coupled to the first node, and operable to control a maximum current amount of the corresponding cell current depending on the voltage level of the first node; and
- an additional second clamp part coupled between the additional reference resistance cell and the fourth input terminal, and operable to control a maximum current amount of the corresponding reference current depending on the voltage level of the first node.

9. The electronic device of claim 1, further comprising a microprocessor which includes:
- a control unit configured to receive a signal including a command from an outside of the microprocessor, and performs extracting, decoding of the command, or controlling input or output of a signal of the microprocessor;
- an operation unit configured to perform an operation based on a result that the control unit decodes the command; and
- a memory unit configured to store data for performing the operation, data corresponding to a result of performing the operation, or an address of data for which the operation is performed, wherein the semiconductor memory is part of the memory unit in the microprocessor.

10. The electronic device of claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit, wherein the semiconductor memory that is part of the cache memory unit in the processor.

11. The electronic device of claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside, wherein the semiconductor memory is part of the auxiliary memory device or the main memory device in the processing system.

12. The electronic device of claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside, wherein the semiconductor memory is part of the storage device or the temporary storage device in the data storage system.

13. The electronic device of claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside, wherein the semiconductor memory is part of the memory or the buffer memory in the memory system.

14. The electronic device of claim 2, wherein the semiconductor memory further comprises:
an additional switching part coupled between the first node and a second node and driven to be turned on in a different period except the charging period and the discharging period, the second node being connected with the clamp voltage generation block.

15. The electronic device of claim 2, wherein the clamp voltage generation block comprises:
a current source;
a replica resistor cell; and
a coupling element having a first terminal coupled to the current source, a second terminal coupled to the replica resistor cell, and a third terminal coupled to the first node or the second node.

16. The electronic device of claim 1, wherein the plurality of resistive storage cells include a resistive storage cell including a variable resistance element with a structure in which a tunnel barrier layer is interposed between two magnetic layers.

17. The electronic device of claim 1, wherein the reference resistance cell has a resistance value between the different resistance values of each resistive storage cell.

18. The electronic device of claim 2, wherein the clamp voltage has a maximum value during the charging period, the maximum value less than of the electronic device without the voltage stabilization block.

19. The electronic device of claim 2, wherein the clamp voltage has a minimum value during the discharging period, the minimum value less than of the electronic device without the voltage stabilization block.

* * * * *